United States Patent
Iguchi et al.

(10) Patent No.: US 7,019,400 B2
(45) Date of Patent: Mar. 28, 2006

(54) SEMICONDUCTOR DEVICE HAVING MULTILAYER INTERCONNECTION STRUCTURE AND METHOD FOR MANUFACTURING THE DEVICE

(75) Inventors: Manabu Iguchi, Kanagawa (JP); Akira Matumoto, Kanagawa (JP); Masahiro Komuro, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/805,403

(22) Filed: Mar. 22, 2004

(65) Prior Publication Data

US 2004/0188845 A1     Sep. 30, 2004

(30) Foreign Application Priority Data

Mar. 24, 2003   (JP)   ............................. 2003-080099
Nov. 6, 2003    (JP)   ............................. 2003-377009

(51) Int. Cl.
*H01L 29/40*    (2006.01)
*H01L 21/4763*  (2006.01)
*H01L 21/44*    (2006.01)
*H01L 21/311*   (2006.01)

(52) U.S. Cl. ...................... 257/758; 257/758; 257/759; 257/773; 257/774; 438/629; 438/637; 438/640; 438/666; 438/701

(58) Field of Classification Search ................ 257/758, 257/773; 438/629, 666
See application file for complete search history.

(56) References Cited

U.S. PATENT DOCUMENTS

| 6,040,243 | A  | * | 3/2000  | Li et al. ..................... 438/687 |
| 2002/0024115 | A1 | * | 2/2002 | Ibnabdeljalil et al. ....... 257/620 |
| 2002/0125577 | A1 | * | 9/2002 | Komada ..................... 257/774 |
| 2003/0157794 | A1 | * | 8/2003 | Agarwala et al. .......... 438/627 |
| 2003/0227089 | A1 | * | 12/2003 | Watanabe et al. .......... 257/758 |
| 2004/0150073 | A1 | * | 8/2004 | Matumoto et al. ......... 257/630 |

FOREIGN PATENT DOCUMENTS

JP          2000-150429          5/2000

* cited by examiner

*Primary Examiner*—Nathan J. Flynn
*Assistant Examiner*—Benjamin P. Sandvik
(74) *Attorney, Agent, or Firm*—McGinn IP Law Group, PLLC

(57) ABSTRACT

A semiconductor device having a multilayer interconnection structure includes a chip semiconductor substrate, a plurality of interlayer insulating layers disposed on the chip semiconductor substrate, a circuit section disposed on the chip semiconductor substrate, and a plurality of walls that extend through the interlayer insulating layers and are arranged along the peripheral portions of the chip semiconductor substrate such that the walls surround the circuit section. The walls include upper sub-walls and lower sub-walls. The upper sub-walls extend through one of the interlayer insulating layers and further extend into another one of the interlayer insulating layers disposed under the layer through which the upper sub-walls extend. The lower sub-walls extend through one of the interlayer insulating layers disposed under the layer through which the upper sub-walls extend. Lower portions of the upper sub-walls each extend into corresponding upper portions of the lower sub-walls.

18 Claims, 8 Drawing Sheets

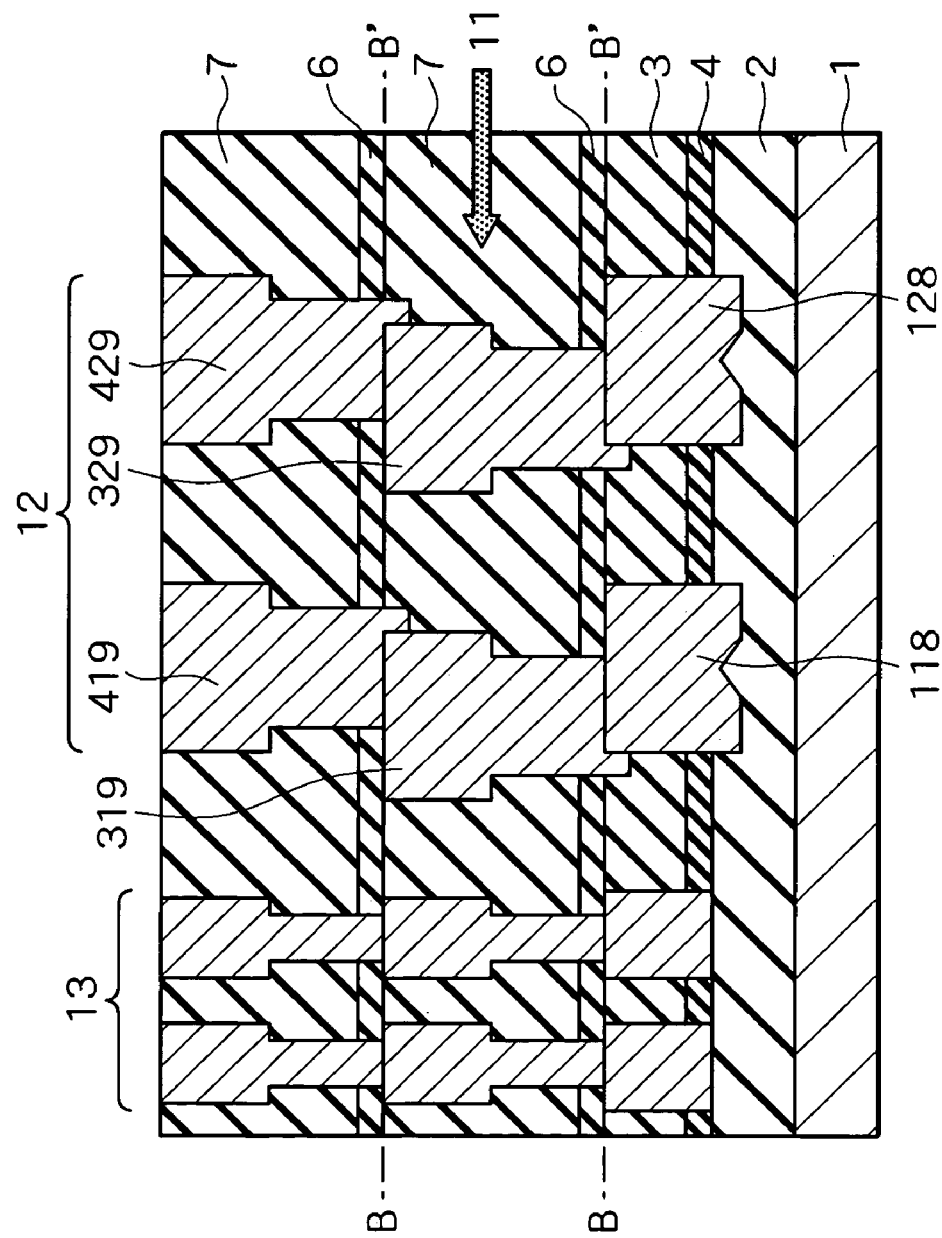

SEMICONDUCTOR DEVICE HAVING MULTILAYER INTERCONNECTION STRUCTURE AND METHOD FOR MANUFACTURING THE DEVICE

BACKGROUND OF THE INVENTION

1. Field of the Invention

The present invention relates to a semiconductor device and methods for manufacturing the same. The present invention particularly relates to a semiconductor device having a multilayer interconnection structure and a seal ring structure in which wires and via contacts surround a circuit section and also relates to a method for manufacturing such a device.

2. Description of the Related Art

The penetration of moisture into semiconductor packages causes the reliability of semiconductor devices to be seriously decreased. In general, semiconductor devices are formed on a wafer and the resulting wafer is diced into chips, which are formed into semiconductor packages. In this procedure, moisture can penetrate the chips through end faces thereof during or after the dicing operation.

In particular, when the semiconductor devices have a multilayer interconnection structure including interlayer insulating layers with low dielectric constant, the above problem is serious because such layers usually have low density and is therefore apt to suffer from moisture penetration.

In order to solve the problem, a seal ring structure has been proposed. The seal ring structure is defined as a ring-shaped wiring structure including wires and via contacts completely surrounding a circuit section. Seal rings extending through layers are formed together with internal wires and via contacts for forming the circuit section, and an additional photoresist step for forming seal rings is not therefore necessary. The resulting seal rings are vertically connected to each other. In the seal ring structure, since metal wires and insulating layers having high moisture resistance function as "barriers" that prevent moisture from penetrating the chips through end faces thereof, moisture can be prevented from penetrating the circuit section, which can therefore be prevented from being corroded.

FIG. 1 is a sectional view showing a first prior art semiconductor device having a single-damascene structure. The device is herein used for describing the penetration of moisture into the wiring structure. In the single-damascene structure, the following layers are disposed on a silicon substrate 1 in this order: an insulating layer 2 including elements, a first stopper layer 4, a first interlayer insulating layer 3, a second stopper layer 6, a second interlayer insulating layer 5, another first stopper layer 4, another first interlayer insulating layer 3, another second stopper layer 6, another second interlayer insulating layer 5, another first stopper layer 4, and another first interlayer insulating layer 3.

Wires 8, inside sealing wires 18, and outside sealing wires 28 extend through the first interlayer insulating layers 3 and first stopper layers 4. Via contacts 9, inside sealing via contacts 19, and outside sealing via contacts 29 extend through the second interlayer insulating layers 5 and second stopper layers 6. The wires 8 and via contact 9 form a circuit section 13, and the inside sealing wires 18, outside sealing wires 28, inside sealing via contacts 19, and outside sealing via contacts 29 form a seal ring section 12. The circuit section 13 is surrounded by the seal ring section 12.

With reference to FIG. 1, the wires 8 each lie on the corresponding via contacts 9, the inside sealing wires 18 each lie on the corresponding inside sealing via contacts 19, and the outside sealing wires 28 each lie on the corresponding outside sealing via contacts 29. That is, in the seal ring section 12, pairs of the inside sealing via contacts 19 and outside sealing via contacts 29 are alternately stacked and pairs of the inside sealing wires 18 and outside sealing wires 28 are alternately stacked.

Since the wires 8 and via contacts 9 are independently formed, the single-damascene structure necessarily has interfaces A–A' between the first stopper layers 4 and second interlayer insulating layers 5 and interfaces B–B' between the second stopper layers 6 and first interlayer insulating layers 3. These interfaces are flat and are each continuous with corresponding interfaces between the wires 8 and via-holes 9. Therefore, when moisture 11 penetrates the circuit section 13 from the outside, the moisture 11 passes through the first interlayer insulating layers 3, first stopper layers 4, second interlayer insulating layers 5, and second stopper layers 6 functioning as insulating layers and also travels along interfaces A–A' and interfaces B–B'. Since the inside and outside sealing wires 18 and 28 fully extend through pairs of the first interlayer insulating layers 3 and first stopper layers 4 and the inside and outside sealing via-holes 19 and 29 fully extend through pairs the second interlayer insulating layers 5 and second stopper layers 6, the inside and outside sealing wires 18 and 28 and inside and outside sealing via-holes 19 and 29 completely intercept the moisture 11 passing through the insulating layers.

FIG. 2D shows a seal ring structure similar to the above structure. This seal ring structure is prepared according to steps shown in FIGS. 2A to 2D, which are sectional views.

With reference to FIG. 2D, the following layers are disposed on a silicon substrate 1 in this order: an insulating layer 2 including elements, a first interlayer insulating layer 21 containing a low dielectric material, a second interlayer insulating layer 22 containing silicon dioxide, and a third interlayer insulating layer 23 containing a low dielectric material. First metal wires 24 extend through the first interlayer insulating layer 21, second metal wires 25 extend through the second interlayer insulating layer 22 and third interlayer insulating layer 23, and via holes 20 extend through the second interlayer insulating layer 22. A seal ring 26 includes a first sealing layer 126, second sealing layer 226, and third sealing layer 326 that extend through the first, second, and third interlayer insulating layer 21, 22, 23, respectively.

FIGS. 2A to 2D are sectional views showing steps of forming the above components. As shown in FIG. 2A, the insulating layer 2 including the elements (not shown) such as transistors is formed on the silicon substrate 1. The first interlayer insulating layer 21 is then formed on the insulating layer 2. The first interlayer insulating layer 21 usually contains a low dielectric material so as to reduce the capacitance between wires.

As shown in FIG. 2B, a groove for forming the first sealing layer 126 and wiring grooves for forming wires are formed in the first interlayer insulating layer 21. Metal is deposited on the first interlayer insulating layer 21 such that the grooves are filled with the metal. An unnecessary metal layer, disposed on the first interlayer insulating layer 21, is removed by a CMP method, whereby the first metal wires 24 and first sealing layer 126 are formed.

The first sealing layer 126 has a width of about 1 μm and is placed at a position that is located close to a dicing line formed in a subsequent step and located about 10 μm apart from the circuit section 13 in the direction of the dicing line. Examples of a method for filling the grooves with the metal include a reflow process, CVD process, and plating process. In the reflow process, a metal layer is formed by a sputtering process and then melted by heat treatment. In general, examples of the metal include an aluminum alloy and copper.

As shown in FIG. 2C, the second interlayer insulating layer 22 is formed over the resulting first interlayer insulating layer 21 by a plasma CVD process and the third interlayer insulating layer 23 is then formed on the second interlayer insulating layer 22. The second interlayer insulating layer 22 contains silicon dioxide and the third interlayer insulating layer 23 contains a material similar to the low dielectric material contained in the first interlayer insulating layer 21. Silicon dioxide contained in the second interlayer insulating layer 22 has a relative dielectric constant of 4.4, which is greater than that of the low dielectric material.

As shown in FIG. 2D, the via holes 20 are formed in the second interlayer insulating layer 22, grooves are formed in the third interlayer insulating layer 23, and wiring grooves for forming the second and third sealing layers 226 and 326, which lie on the first sealing layer 126 in that order and have the same width as that of the first sealing layer 126, are formed in the second and third interlayer insulating layers 22 and 23, respectively. The via holes 20, grooves, and wiring grooves are filled with the metal according to the same procedure as that for forming the first metal wires 24, whereby the second metal wires 25 and second and third sealing layers 226 and 326 are formed. The first, second, and third sealing layers 126, 226, and 326, which are joined to one another, form the seal ring 26. The seal ring 26 seals the circuit section 13 from moisture coming from the direction of the first and second metal wires 24 and 25.

The steps shown in FIGS. 2C and 2D are then repeated several times, whereby the first and second metal wires 24 and 25 are stacked. In the final step, a passivation layer (not shown) is formed over the top surface, whereby a wafer process is completed. The obtained wafer is cut along dicing lines each extending outside the seal ring 26, that is, the wafer is diced into chips, each of which functions as the semiconductor device.

In the wafer having the above configuration, since the seal ring 26 containing the metal extends through the insulating layers and lies between each dicing line and the circuit section 13, moisture in the atmosphere can be prevented from penetrating the circuit section 13 through cut surfaces formed by cutting the wafer along the dicing lines. Since the first and second metal wires 24 and 25 of the circuit section 13 are placed in a plurality of the insulating layers and the sealing layers are placed in all of the insulating layers, moisture can be securely prevented from penetrating end faces of the semiconductor devices. This configuration is disclosed in, for example, Japanese Unexamined Patent Application Publication No. 2000-150429.

FIG. 3 is a sectional view showing a second prior art semiconductor device having a dual-damascene structure. The device is herein used for describing the penetration of moisture into the structure.

With reference to FIG. 3, the following layers are disposed on a silicon substrate 1 in this order: an insulating layer 2 including elements, a first stopper layer 4, and a first interlayer insulating layer 3. Pairs of second stopper layers 6 and second interlayer insulating layers 7 are disposed on the first interlayer insulating layer 3. Wires 14, via contacts, and sealing wires 10 extend through the second stopper layers 6 and second interlayer insulating layers 7.

In the dual-damascene structure, since the wires 14 and via contacts disposed thereunder are formed in one step, there are no interfaces A–A' shown in FIG. 1 but there are only interfaces B–B' between the second stopper layers 6 and second interlayer insulating layers 7 and interfaces B–B' between the second stopper layers 6 and first interlayer insulating layer 3. Interfaces B–B' are continuous with the interfaces between the via contacts and the sealing wires 10 or wires 14 disposed under the via contacts or connected to the interfaces between the via contacts and first, second, and third wires 8, 18, or 28 disposed under the via contacts. Moisture 11 can pass through the second stopper layers 6 and second interlayer insulating layers 7 and also travel along interfaces B–B' between the second stopper layers 6 and second interlayer insulating layers 7 and interfaces B–B' between the second stopper layers 6 and first interlayer insulating layer 3. Since the sealing wires 10 fully extend through pairs of the second stopper layers 6 and second interlayer insulating layers 7 in the vertical direction, the sealing wires 10 completely intercept the moisture 11 passing through the insulating layers.

However, in the above known examples in which only the seal rings extend across the insulating layers, the penetration of moisture cannot be completely prevented. In the structure shown in FIG. 1, since the adhesion of the wires to the via contacts is weak, the penetration of moisture, which travels along interfaces A–A' between the first stopper layers 4 and second interlayer insulating layers 5 or interfaces B–B' between the second stopper layers 6 and first interlayer insulating layers 3, cannot be completely prevented.

Furthermore, in the structure shown in FIG. 3, since the adhesion of the wires to the via contacts disposed thereon is weak, the penetration of moisture, which travels along interfaces B–B' between the second stopper layers 6 and second interlayer insulating layers 7, cannot be completely prevented.

SUMMARY OF THE INVENTION

Accordingly, it is an object of the present invention to provide a semiconductor device having high reliability and a method for manufacturing the device. In the device, a circuit section is prevented from being corroded because the structure of a seal ring surrounding the circuit section is optimized and moisture passing through chip end faces can therefore be completely prevented from penetrating the circuit section.

A semiconductor device according to the present invention has a multilayer interconnection structure and includes a chip semiconductor substrate, a plurality of interlayer insulating layers disposed on the chip semiconductor substrate, a circuit section disposed on the semiconductor substrate, and a plurality of walls that extend through the interlayer insulating layers and are arranged along the peripheral portions of the chip semiconductor substrate such that the walls surround the circuit section. The walls include upper sub-walls and lower sub-walls. The upper sub-walls extend through one of the interlayer insulating layers and further extend into another one of the interlayer insulating layers disposed under the layer through which the upper sub-walls extend. The lower sub-walls extend through one of the interlayer insulating layers disposed under the layer through which the upper sub-walls extend and are connected to the upper sub-layers such that lower portions of the upper sub-walls each extend into corresponding upper portions of the lower sub-walls.

In the semiconductor device, the upper sub-walls are each connected to the corresponding lower sub-walls such that the center of each upper sub-wall is misaligned with that of each lower sub-wall when viewed from above, and the walls contain at least one selected from the group consisting of Al, Cu, and an alloy containing Al or Cu as a major component.

In the semiconductor device, the interlayer insulating layers each of which includes one or more sub-layers containing at least one selected from the group consisting of $SiO_2$, L-$O_x$(ladder-type hydrogenated siloxane), HSQ, SiOC, SiLK(polyphenylene), SiOF, SiCN, SiC, SiN, or SiON.

In the semiconductor device, the walls comprise a conductor placed in contact holes each extending through the corresponding interlayer insulating layers or a conductor that is placed in the contact holes each extending through the corresponding interlayer and placed in grooves, connected to the contact holes, having an aperture area larger than that of the contact holes. Said grooves may have a depth smaller than that of the contact holes.

A method for manufacturing a semiconductor device according to the present invention includes the steps of forming a plurality of interlayer insulating layers on a substrate and forming a plurality of walls that extend through the interlayer insulating layers and surround circuit sections in such a manner that the walls are joined to one another. The walls include upper sub-walls and lower sub-walls. The upper sub-walls extend through one of the interlayer insulating layers and each extend into the corresponding upper sub-walls. The lower sub-walls extend through one of the interlayer insulating layers disposed under the layer through which the upper sub-walls extend.

In the method of the present invention, the upper sub-walls are each connected to the corresponding lower sub-walls such that the center of each upper sub-wall is misaligned with that of each lower sub-wall when viewed from above.

As described above, the semiconductor device of the present invention has a seal ring structure in which the circuit section is surrounded by wires and via contacts. In the seal ring structure, bottom portions of sealing wires extend to one of interlayer insulating layers disposed therebelow, and sealing via contacts are each connected to the corresponding sealing wires disposed thereunder such that the sealing via contacts are each misaligned with the corresponding sealing wires.

Therefore, the sealing wires extend across the interface between the two interlayer insulating layers; hence, moisture traveling along the interface can be completely intercepted.

Furthermore, the sealing via contacts are connected to the sealing wires disposed thereunder in an offset manner, and the bottom portions of the sealing wires extend into one of interlayer insulating layers disposed therebelow. Therefore, the sealing wires extend across the interface between the two interlayer insulating layers; hence, moisture traveling along the interface can be completely intercepted.

BRIEF DESCRIPTION OF THE DRAWINGS

FIG. 7 is a sectional view showing a semiconductor device according to a second embodiment of the present invention.

DETAILED DESCRIPTION OF THE PREFERRED EMBODIMENTS

Embodiments of the present invention will now be described with reference to the accompanying drawings.

(First Embodiment)

Figure 1:
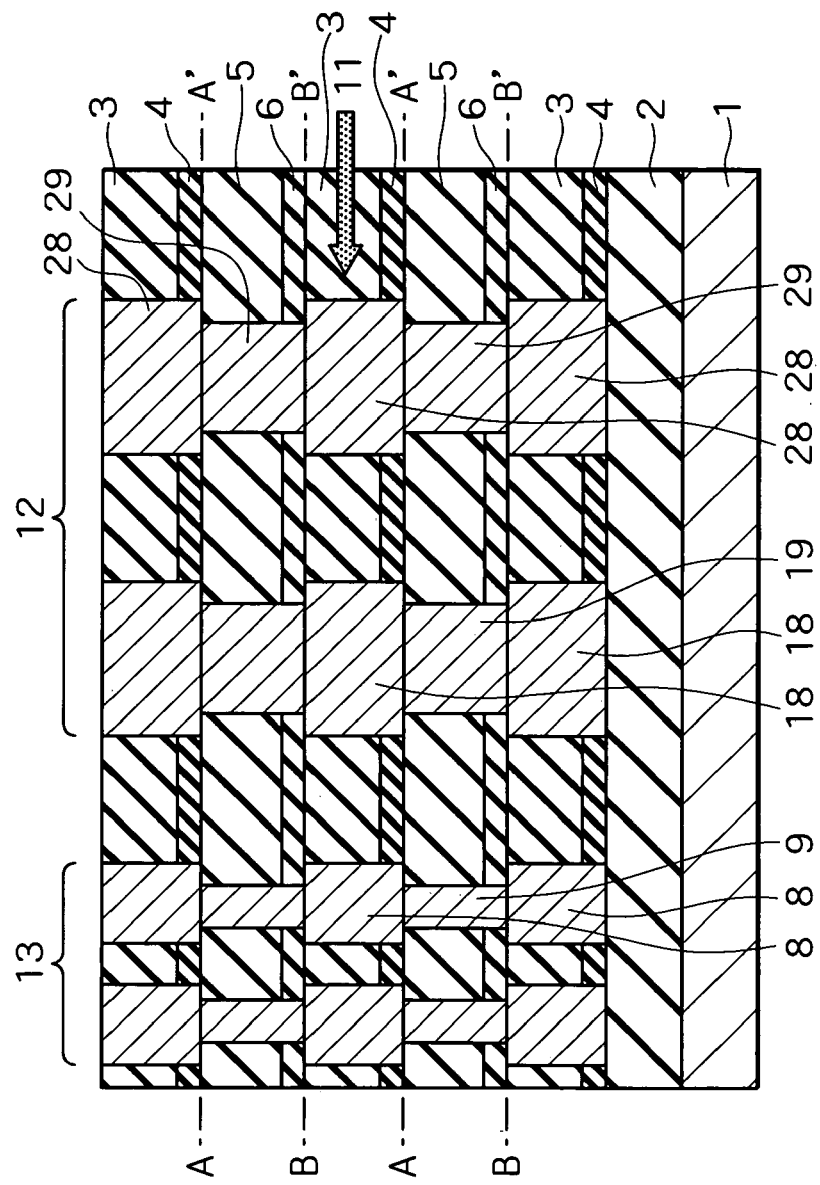
FIG. 1 is a sectional view showing a first prior art semiconductor device having a seal ring structure and a single-damascene structure.
Figure 2A:
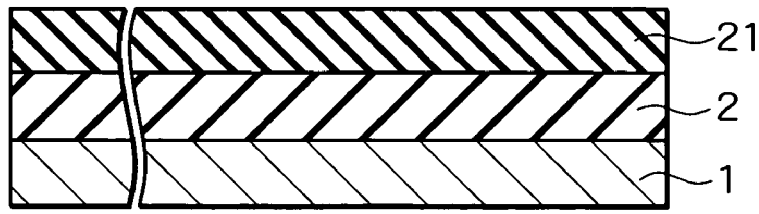
FIGS. 2A to 2D are sectional views showing the steps of manufacturing the semiconductor device shown in FIG. 1.
Figure 2B:
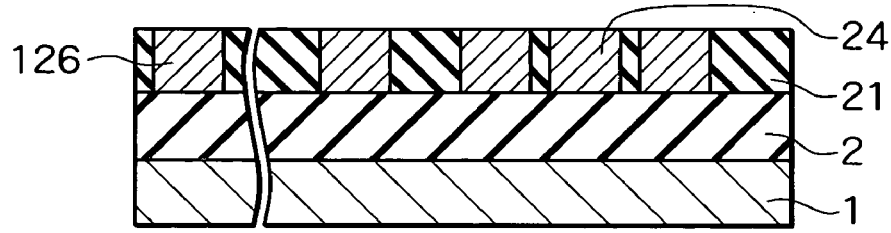
Figure 2C:
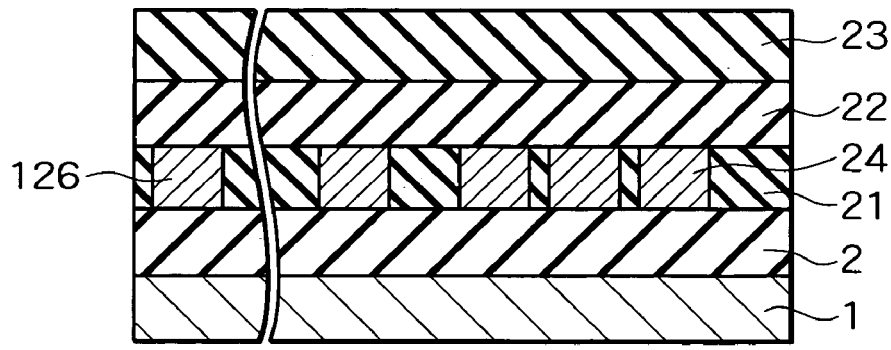
Figure 2D:
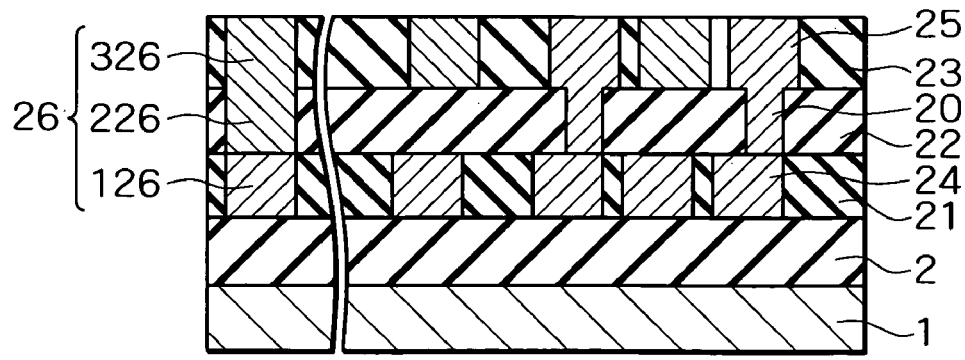
Figure 3:
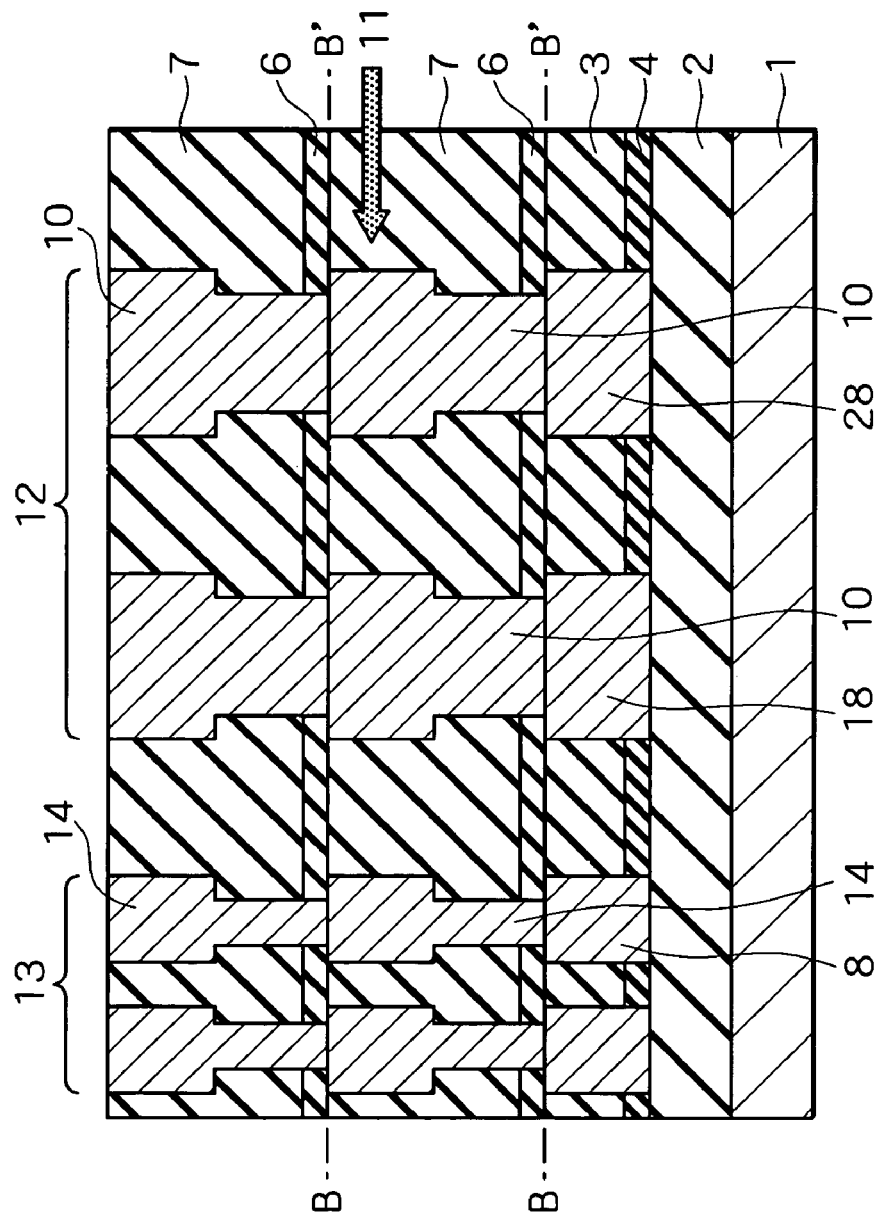
FIG. 3 is a sectional view showing a second prior art semiconductor device having a seal ring structure and a dual-damascene structure.
Figure 4:
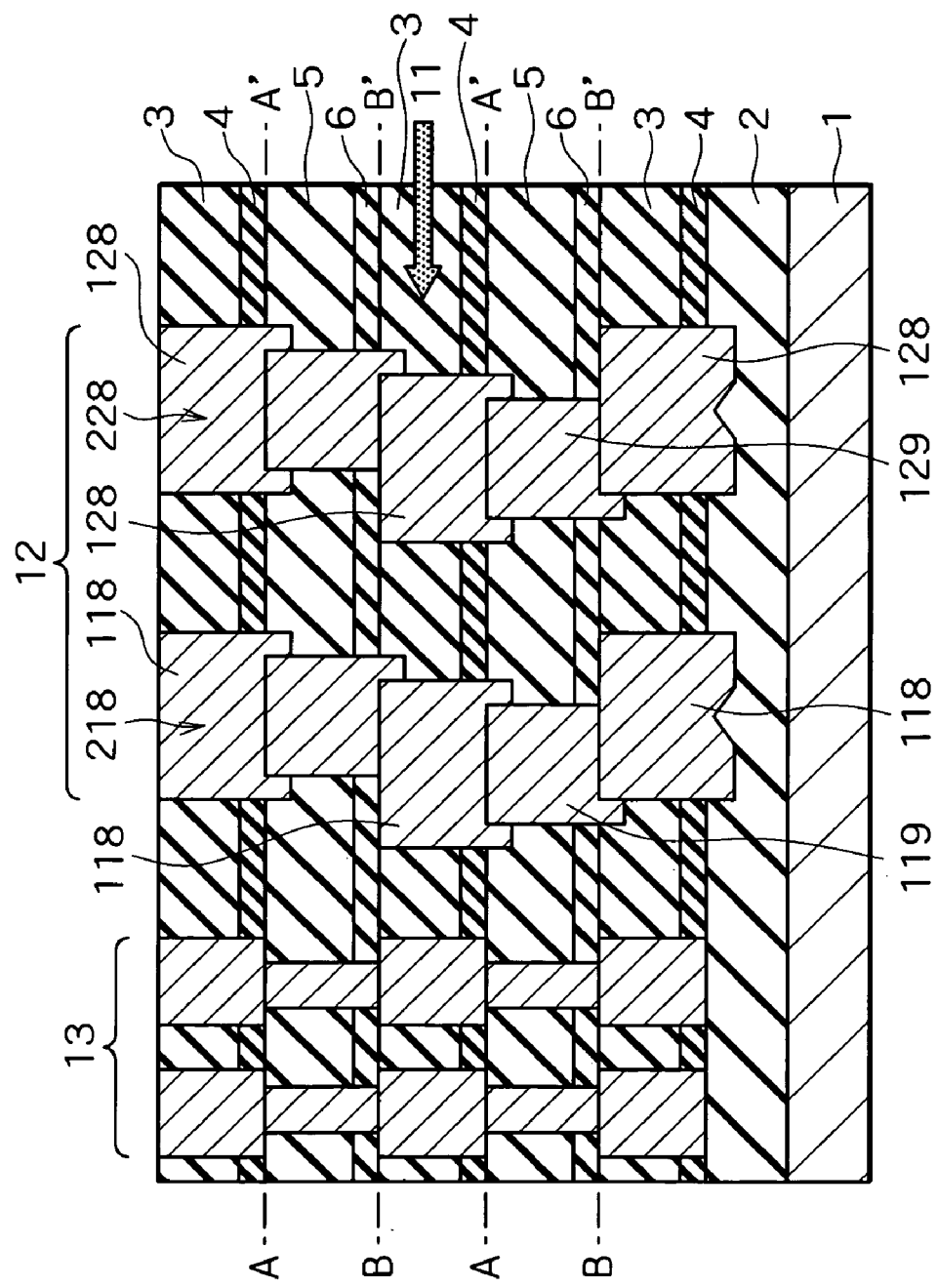
FIG. 4 is a sectional view showing a semiconductor device according to a first embodiment of the present invention.

FIG. 4 is a sectional view showing a semiconductor device having a single-damascene structure according to a first embodiment of the present invention. With reference to FIG. 4, the following layers are disposed on a chip silicon substrate 1 in this order: an insulating layer 2 including elements, a first stopper layer 4, a first interlayer insulating layer 3, a second stopper layer 6, a second interlayer insulating layer 5, another first stopper layer 4, another first interlayer insulating layer 3, another second stopper layer 6, another second interlayer insulating layer 5, another first stopper layer 4, and another first interlayer insulating layer 3.

In this embodiment, a circuit section 13 is completely surrounded by a seal ring section 12. First sealing wires 118 and second sealing wires 128 fully extend through pairs of the first interlayer insulating layers 3 and first stopper layers 4 in the vertical direction. First sealing via contacts 119 and second sealing via contacts 129 fully extend through pairs of the second interlayer insulating layers 5 and second stopper layers 6 in the vertical direction. The first sealing wires 118 and first sealing via contacts 119 form a first ring, and the second sealing wires 128 and second sealing via contacts 129 form a second ring. The second ring is located outside the first ring and close to a dicing line. The circuit section 13 is placed in a double-ring structure consisting of the first and second rings.

According to the above configuration, moisture passing through the insulating layers can be completely intercepted by the first and second sealing wires 118 and 128 and the first and second sealing via contacts 119 and 129.

Since the bottom portions of the first and second sealing wires 118 and 128 extend into the second interlayer insulating layers 5 or the insulating layer 2, the first and second sealing wires 118 and 128 extend across interfaces A–A' between the first stopper layers 4 and second interlayer insulating layers 5 or insulating layer 2. Thus, moisture traveling along interfaces A–A' between the first stopper layers 4 and second interlayer insulating layers 5 or insulating layer 2 can be completely intercepted.

The first sealing via contacts 119 are each connected to the corresponding first sealing wires 118 and the second sealing via contacts 129 are each connected to the corresponding second sealing wires 128 in an offset manner. Furthermore, the bottom portions of the first and second sealing via contacts 119 and 129 extend into the first interlayer insulating layers 3. Therefore, the first and second sealing via contacts 119 and 129 extend across interfaces B–B' between the second stopper layers 6 and first interlayer insulating layers 3 in the vertical direction. Thus, the first and second sealing via contacts 119 and 129 can prevent the penetration of moisture traveling along interfaces B–B' between the second stopper layers 6 and first interlayer insulating layers 3.

The first and second sealing wires 118 and 128 and first and second sealing via contacts 119 and 129 may contain Al or Cu. The first interlayer insulating layers 3 and second interlayer insulating layers 5 may contain $SiO_2$, L-$O_x$(ladder-type hydrogenated siloxane), HSQ, SiOC, SiLK polyphenylene, SiOF, SiCN, SiC, SiN, or SiON.

Figure 5A:
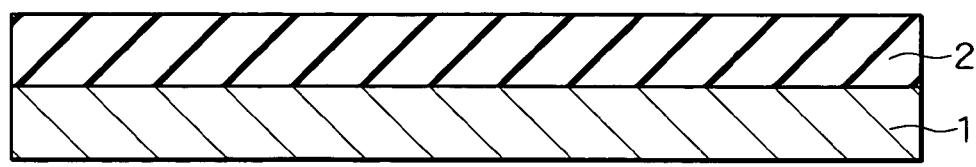
FIGS. 5A to 5C are sectional views showing the steps of manufacturing the semiconductor device shown in FIG. 4.
Figure 5B:
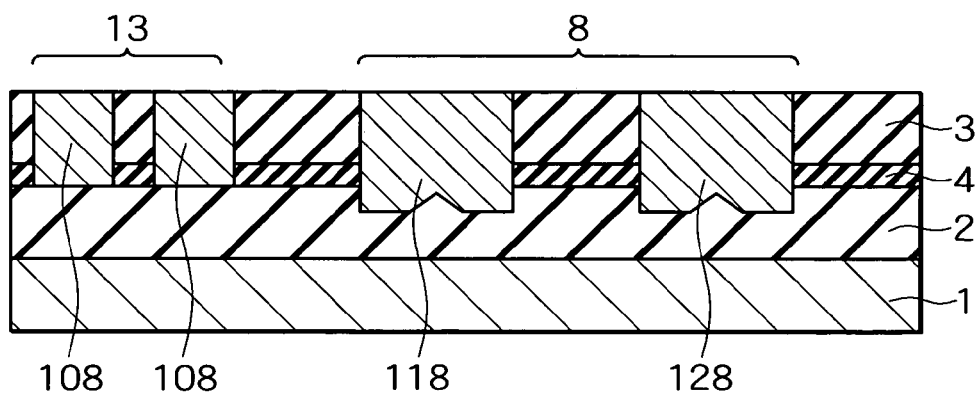
Figure 5C:
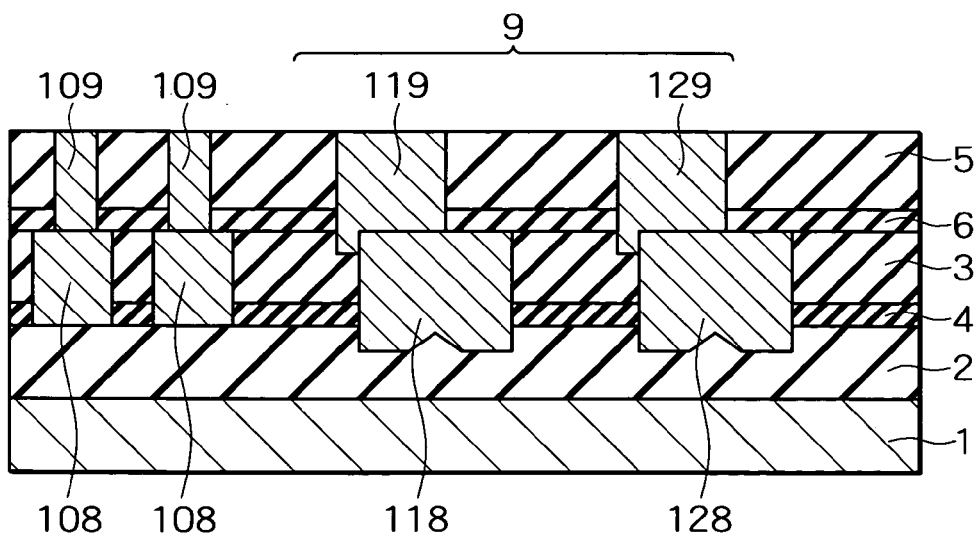

FIGS. 5A to 5C are sectional views showing steps of manufacturing the semiconductor device shown in FIG. 4.

As shown in FIG. 5A, the insulating layer 2 including the elements is formed on the silicon substrate 1. One of the first stopper layers 4 and one of the first interlayer insulating layers 3 are formed on the insulating layer 2 in that order.

As shown in FIG. 5B, wiring grooves extending through the first interlayer insulating layer 3 and first stopper layer 4 are formed. The first interlayer insulating layers 3 may each include two or more different insulating sub-layers. In FIG. 5B, the wiring grooves, in which the first and second sealing wires 118 and 128 are formed in a subsequent step, are formed by an etching process such that the wiring grooves extend to the insulating layer 2. In FIG. 5C, the wiring grooves located in the second or more levels are formed by an etching process such that the wiring grooves extend to the second interlayer insulating layers 5. After the wiring grooves are formed, metal such as Cu or Al is deposited on the first interlayer insulating layer 3 such that the wiring grooves are fully filled with the metal. An unnecessary layer, disposed on the first interlayer insulating layer 3, containing the metal is removed by a metal CMP (chemical mechanical polishing) process. According to the above procedure, the first and second sealing wires 128 having a ring shape and first internal wires 108 are formed as shown in FIG. 5B.

As shown in FIG. 5C, one of the second stopper layers 6 and one of the second interlayer insulating layers 5 are formed over the first internal wires 108 and the first and second sealing wires 118 and 128 in that order. The second interlayer insulating layers 5 may each include two or more different sub-layers. Via holes are formed by an etching process such that the via holes extend through the resulting second stopper layer 6 and second interlayer insulating layer 5 to the first interlayer insulating layer 3 on the insulating layer 2. After the via holes are formed, metal such as Cu or Al is deposited on the second interlayer insulating layer 5 such that the via holes are filled with the metal. An unnecessary metal layer, disposed on the second interlayer insulating layer 5, is then removed by a CMP process. The bottom portions of the first and second sealing via contacts 119 and 129 extend into the first interlayer insulating layer 3. The center of each first sealing via contact 119 is slightly misaligned with that of each first sealing wire 118 and the center of each second sealing via contact 129 is slightly misaligned with that of each second sealing wires 128 when viewed from above.

Figure 6:
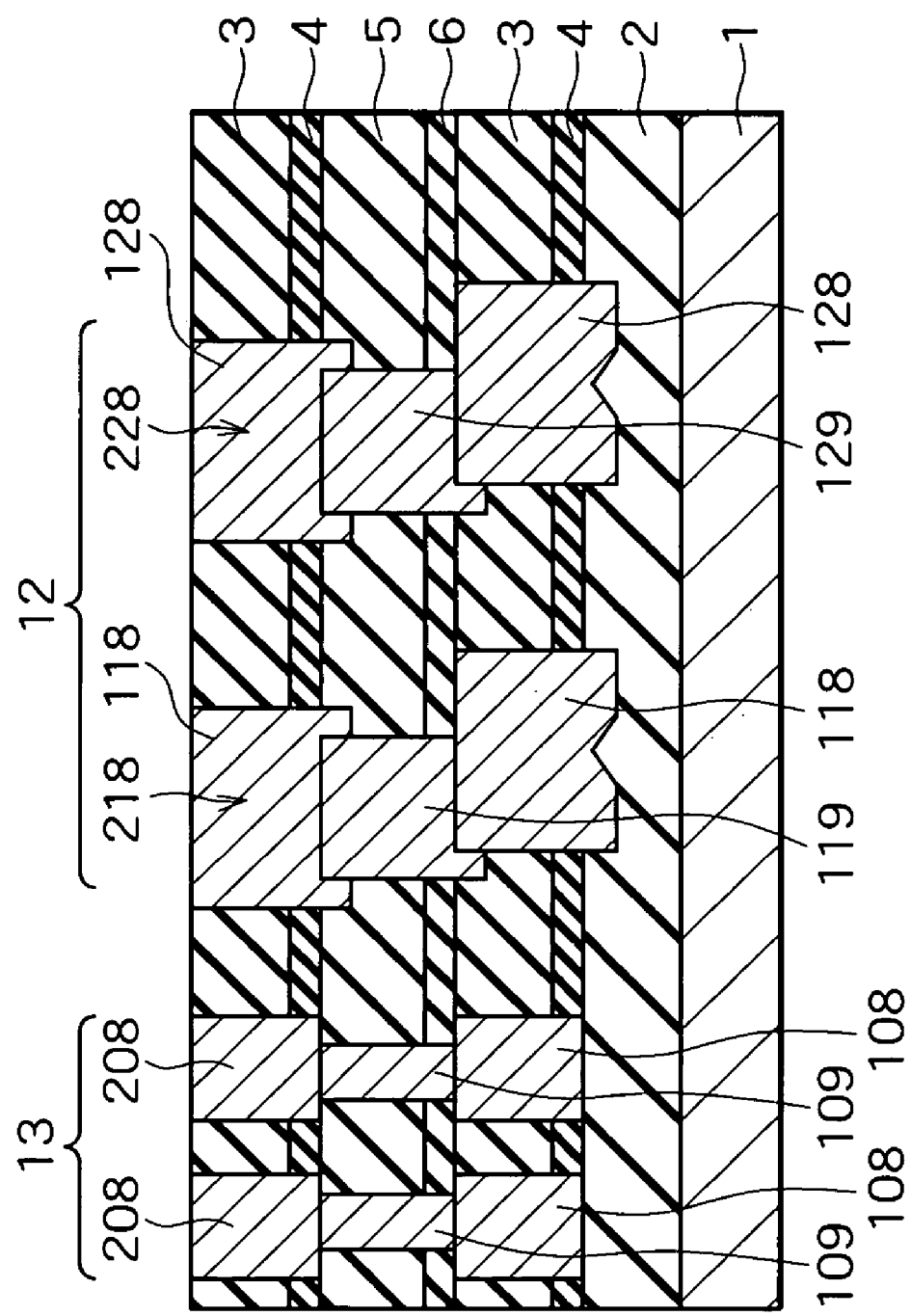
FIG. 6 is a sectional view showing a step of manufacturing the semiconductor device shown in FIG. 4, the step being subsequent to the step shown in FIG. 5C.

As shown in FIG. 6, one of the first interlayer insulating layers 3 is formed on the resulting second interlayer insulating layer 5, and second internal wires 208, inner sealing wires 218, and outer sealing wires 228 are then formed in the first interlayer insulating layer 3. This forming step is the same as that shown in FIG. 5B.

Subsequently, the step shown in FIG. 5C and the step shown in FIG. 6 are repeated, whereby the single-damascene structure shown in FIG. 4 can be prepared.

As described above, in this embodiment, the circuit section 13 is surrounded by a plurality of stacked seal rings including the first and second sealing wires 118 and 128 and first and second sealing via contacts 119 and 129. The bottom portions of the sealing wires extend into the interlayer insulating layers disposed thereunder, and the sealing wires are each connected to the corresponding sealing via contacts such that the center of each sealing wire is slightly misaligned with that of each sealing via contact. The bottom portions of the sealing via contacts extend into the interlayer insulating layers disposed thereunder. Therefore, the bottom portions of the sealing wires extend across two interfaces between the interlayer insulating layers; hence, moisture traveling along the interfaces between the insulating layers can be completely intercepted.

(Second Embodiment)

FIG. 7 is a sectional view showing a semiconductor device having a dual-damascene structure according to a second embodiment of the present invention. In this embodiment, a circuit section 13 is completely surrounded by a seal ring section 12. First sealing wires 419 and second sealing wires 429 also functioning as via contacts extend through interlayer insulating layers 7 and second stopper layers 6 disposed thereunder in the vertical direction. Therefore, moisture passing through the interlayer insulating layers 7 and second stopper layers 6 can be completely intercepted.

The first sealing wires 419 are each connected to corresponding third sealing wires 319 disposed thereunder such that the center of each first sealing wire 419 is misaligned with that of each third sealing wire 319, and the second sealing wires 429 are each connected to corresponding fourth sealing wires 329 disposed thereunder such that the center of each second sealing wire 429 is misaligned with that of each fourth sealing wire 329. The bottom portions of the first and the second wires 419, 429 extend into the interlayer insulating layers 7 formed thereunder. Therefore, the sealing wires extend across interfaces B–B' between the interlayer insulating layers 7 and second stopper layers 6 disposed thereunder in the vertical direction; hence, moisture traveling along interfaces B–B' can be completely intercepted. Furthermore, the third sealing wires 319 are each connected to corresponding fifth sealing wires 118 disposed thereunder such that the center of each third sealing wire 319 is misaligned with that of each fifth sealing wire 118, and the fourth sealing wires 329 are each connected to corresponding sixth sealing wires 128 disposed thereunder such that the center of each fourth sealing wire 329 is misaligned with that of each sixth sealing wire 128. The bottom portions of the third and fourth sealing wires 319 and 329 extend into a first interlayer insulating layer 3. The fifth and sixth sealing wires 118 and 128 extend through the first interlayer insulating layer 3 and the bottom portions of the fifth and sixth sealing wires 118 and 128 extend into an insulating layer 2 including elements in common with the structure of the first embodiment described with reference to FIGS. 4 to 6.

Figure 8A:
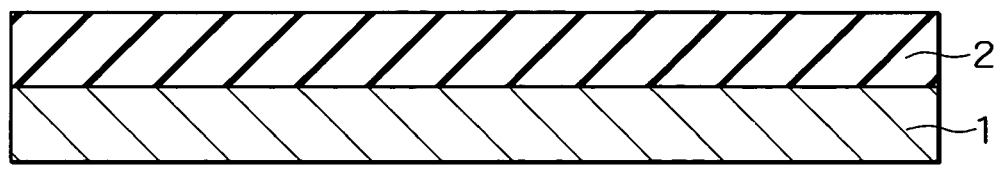
FIGS. 8A to 8C are sectional views showing the steps of manufacturing the semiconductor device shown in FIG. 7.
Figure 8B:
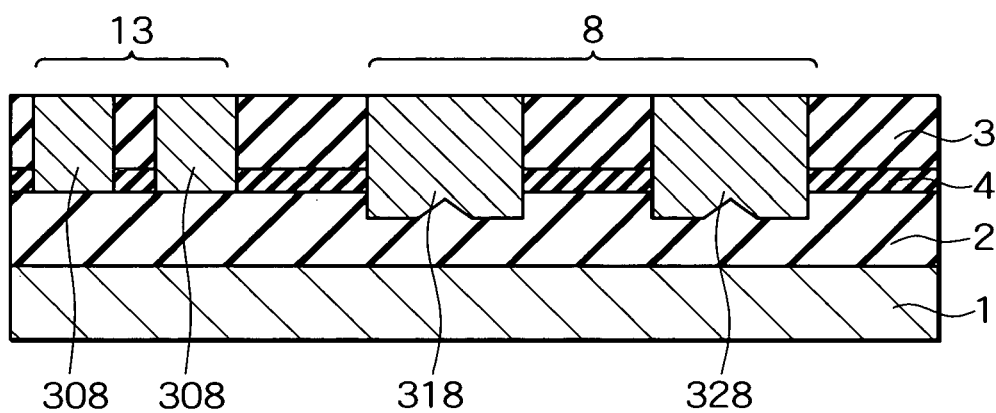
Figure 8C:
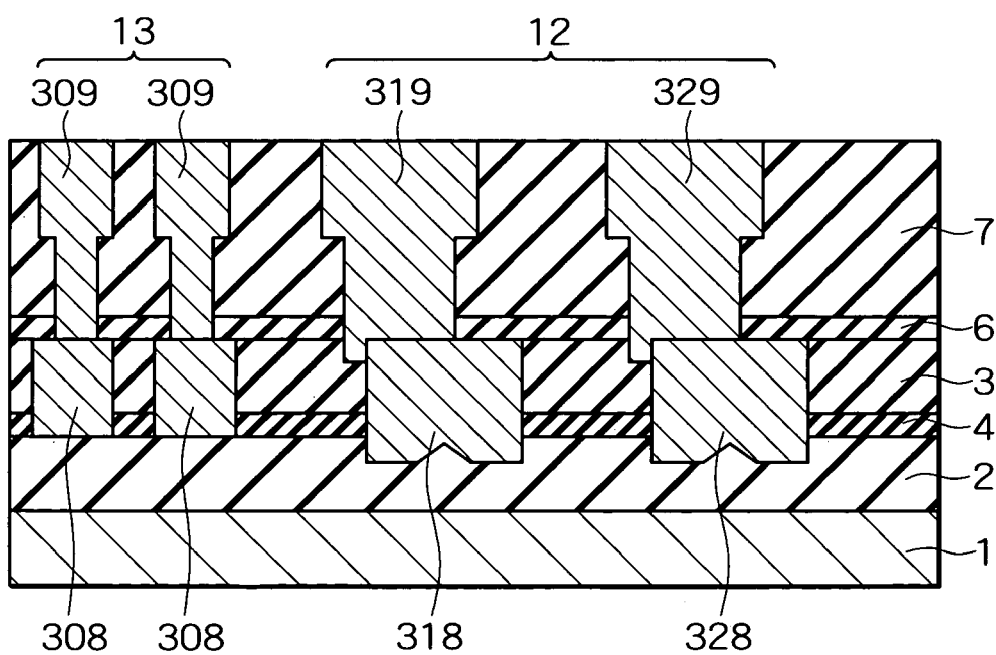

FIGS. 8A to 8C are sectional views showing steps of manufacturing the semiconductor device of this embodiment. As shown in FIG. 8A, the insulating layer 2 including the elements is formed on the silicon substrate 1.

As shown in FIG. 8B, a first stopper layer 4 and the first interlayer insulating layer 3 are formed on the insulating layer 2 in that order. Wiring grooves are formed such that the grooves extend through the first interlayer insulating layer 3 and first stopper layer 4 and further extend into the insulating layer 2. The first interlayer insulating layer 3 may include two or more different sub-layers.

The following wires are then formed internal wires 308 for forming the circuit section 13 and the first sealing wires 118 and second sealing wires 128, having a ring shape, surrounding the internal wires 308.

The wiring grooves for forming the first and second sealing wires 118 and 128 are formed by an etching process such that the wiring grooves extend through the first interlayer insulating layer 3 and first stopper layer 4 and further extend into the insulating layer 2, as shown in FIG. 8B. After the wiring grooves are formed, metal such as Cu or Al is deposited on the first interlayer insulating layer 3 such that the wiring grooves are filled with the metal. An unnecessary layer, disposed on the first interlayer insulating layer 3, containing the metal is removed by a metal CMP process.

As shown in FIG. 8C, one of the second stopper layers 6 and one of the interlayer insulating layers 7 are formed over the first interlayer insulating layer 3 in that order. The interlayer insulating layers 7 may each include two or more different sub-layers. Via holes are formed such that the via holes extend through the resulting interlayer insulating layer 7 and second stopper layer 6 and further extend into the first interlayer insulating layer 3. After the via holes are formed, metal such as Cu or Al is deposited on the interlayer insulating layer 7 such that the via holes are filled with the metal. An unnecessary metal layer, disposed on the interlayer insulating layer 7, is removed by a metal CMP process.

According to the above procedure, the following components for the dual-damascene structure are formed as shown in FIG. 8C: internal wires 309 for forming the circuit section 13, and the third and fourth sealing wires 319 and 329 for forming the seal ring section 12.

Subsequently, the step shown in FIG. 8C is repeated, whereby the dual-damascene structure having a number of layers shown in FIG. 7 or a larger number of layers can be obtained.

In this embodiment, the sealing wires extend across interfaces between the stopper layers and interlayer insulating layers disposed thereunder; hence, moisture traveling along the interfaces can be completely intercepted.

What is claimed is:

1. A semiconductor device having a multilayer interconnection structure, comprising:
    a chip semiconductor substrate;
    a plurality of interlayer insulating layers disposed on the chip semiconductor substrate;
    a circuit section disposed on the chip semiconductor substrate;
    a seal ring section comprising a seal ring structure; and
    a plurality of walls of the seal ring structure that extend through the interlayer insulating layers and are arranged along a peripheral portion of the chip semiconductor substrate such that the walls surround the circuit section,
    wherein the walls include upper sub-walls and lower sub-walls, the upper sub-walls extending through an interlayer insulating layer for an upper wiring layer, which is one of the interlayer insulating layers, and further extending into another interlayer insulating layer for a lower wiring layer adjacent to the upper wiring layer, and the lower sub-walls extend through the interlayer insulating layer for the lower wiring layer through which the upper sub-walls extending and connecting to the upper wiring layer such that lower portions of the upper wiring layers each extend into corresponding upper portions of the lower sub-walls.

2. The semiconductor device according to claim 1, wherein the upper sub-walls are connected to the corresponding lower sub-walls such that the center of said upper sub-walls is misaligned with that of said lower sub-walls when viewed from above.

3. The semiconductor device according to claim 1, wherein the walls comprise at least one of Al, Cu, and an alloy comprising at least one of Al and Cu as a major component.

4. The semiconductor device according to claim 1, wherein the interlayer insulating layers include at least one sub-layers comprising at least one of $SiO_2$, L-$O_x$(ladder-type hydrosiloxane), HSQ, SiOC, SiLK(polyphenylene), SiOF, SiCN, SiC, SiN, and SiON.

5. The semiconductor device according to claim 1, wherein the walls comprise at least one of a conductor placed in contact holes extending through the corresponding interlayer insulating layers and a conductor that is placed in the contact holes extending through the corresponding interlayer and placed in grooves, connected to the contact holes, comprising an aperture area larger than that of the contact holes.

6. The semiconductor device according to claim 1, wherein the plurality of walls comprise at least one of Al, Cu, and an alloy comprising at least one of Al and Cu as a major component.

7. The semiconductor device according to claim 1, wherein the interlayer insulating layers comprise at least one sub-layer comprising at least one of $SiO_2$, L-$O_x$(ladder-type hydrosiloxane), HSQ, SiOC, SiLK(polyphenylene), SiOF, SiCN, SiC, and SiON.

8. The semiconductor device according to claim 1, wherein said upper sub-walls comprise sealing wires.

9. The semiconductor device according to claim 1, wherein said lower sub-walls comprise via contacts.

10. The semiconductor device according to claim 1, wherein the semiconductor device comprises a single-damascene structure.

11. The semiconductor device according to claim 1, wherein the semiconductor device comprises a double-damascene structure.

12. The semiconductor device according to claim 1, wherein said plurality of walls comprise sealing wires that extend across interfaces between said interlayer insulating layers and stopper layers.

13. The semiconductor device according to claim 1, wherein said upper sub-walls and said lower sub-walls extend across an interface between said interlayer insulating layers and a stopper layer.

14. The semiconductor device according to claim 1, wherein said upper sub-walls and said lower sub-walls overlap.

15. The semiconductor device according to claim 14, wherein said upper sub-walls and said lower sub-walls overlap across a contact point of said plurality of interlayer insulating layers and a stopping layer.

16. A semiconductor device having a multilayer interconnection structure, comprising:
    a chip semiconductor substrate;
    a plurality of interlayer insulating layers disposed on the chip semiconductor substrate;

a circuit section disposed on the chip semiconductor substrate; and a seal ring section comprising a seal ring structure;

wherein a plurality of walls of the seal ring structure that extend through the interlayer insulating layers and are arranged along a peripheral portion of the chip semiconductor substrate such that the walls surround the circuit section, and an interface between an upper wiring layer and a lower wiring layer being adjacent to the upper wiring layer has a portion which is not on the same plan as an interface between an interlayer insulating layer for the upper wiring layer and another interlayer insulating layer for the lower wiring layer in the seal ring section.

17. A method for manufacturing a semiconductor device, comprising:

forming a plurality of interlayer insulating layers on a substrate; and forming a plurality of walls of a seal ring structure that extend through the interlayer insulating layers and surround circuit sections in such a manner that the walls are joined to one another, wherein the walls include upper sub-walls and lower sub-walls, the upper sub-walls extending through an interlayer insulating layer for an upper layer, which is one of the interlayer insulating layers, and further extending into another interlayer insulating layer for a lower layer adjacent to the upper layer, and the lower sub-walls extending through the interlayer insulating layer for the lower layer through which the upper sub-walls extend and connecting to the upper layer such that lower portions of the upper layers each extend into corresponding upper portions of the lower sub-walls.

18. The method for manufacturing a semiconductor device according to claim 17, wherein the upper sub-walls are connected to the corresponding lower sub-walls such that a center of the upper sub-walls is misaligned with that of the lower sub-walls when viewed from above.

* * * * *